150

United States Patent Office 3,104,167

Patented Sept. 17, 1963

HNO3 HF strip Ni 3,104,167

METHOD AND SOLUTION FOR SELECTIVELY STRIPPING ELECTROLESS NICKEL FROM A SUBSTRATE

Jerome E. Cotteta, Norristown, Pa., assignor, by mesne assignments, to Philco Corporation, Philadelphia, Pa., a corporation of Delaware No Drawing. Filed Feb. 11, 1960, Ser. No. 7,989
7 Claims. (Cl. 75—97)

This invention relates to a method for selectively removing electroless nickel from a body upon which it is coated and to a solution which is particularly useful in practicing this method. While not limited thereto the invention is particularly useful in reclaiming transistors having a defective plating of electroless nickel thereon.

A transistor normally comprises a metal can which encloses the semiconductive element thereof. Typically this can is composed of nickel, copper or cold-rolled steel. External connections are made to the semiconductive element and to emitter and collector elements positioned thereon by lead wires passing through and sealed to a glass stem. These wires typically are made of Dumet wire, which comprises a core of a low-expansion nickel-iron alloy coated with borated copper. The glass stem in turn is secured to the metal can by a cylindrical sleeve sealed to the glass stem and welded to the metal can. Typically this sleeve is composed of copper, cold-rolled steel or Kovar. Kovar is a trademark for a series of cobalt-nickel-iron alloys of the type described in expired U.S. Patent No. 2,062,335 to H. Scott. One such alloy is composed of 54 percent by weight of iron, 29 percent by weight of nickel, 17 percent by weight of cobalt and traces of manganese and carbon.

To render the lead wires readily solderable, to protect the can, cylindrical sleeve and lead wires against corrosion, to provide an attractive finish for the transistor or to provide a suitable base layer for the electroless plating of gold thereon, a coating of electroless nickel frequently is applied to the can, sleeve and lead wires. Electroless nickel consists essentially of nickel and phosphorus, the latter being present in an amount between about 6 and about 13 percent by weight. Processes for depositing electroless nickel on substrates are well known, being taught for example in the article "Electroless Plating Comes of Age," by Dr. Abner Brenner, published in "Metal Finishing," November-December 1954.

In the mass production of transistors, the containers and lead wires thereof typically are plated with electroless nickel by immersing a batch of several hundred transistors encapsulated in their metal containers into an electroless nickel plating bath. However the pre-immersion cleansing of the transistors and leads occasionally is inadequate or the plating bath is defective. As a result the electroless nickel coating deposited on many or all of the transistors in the batch is unsatisfactory in appearance or physical properties, e.g. the plating is rough or does not have a uniformly bright metallic lustre, regions of the container or leads are unplated, or the plating peels, powders, or flakes from the underlying metal. Such defectively plated transistors are unsalable. Heretofore these transistors had to be discarded by their manufacturers because no method was known for cheaply and rapidly removing the defective electroless nickel plating from the can, sleeve and lead wires without either injuriously corroding the metals of which these parts are fabricated or dissolving the glass stem of the transistor. Because the defective plating could not be removed from these transistors by a commercially practicable method, it was not feasible to replate them. Because each of these unsalable transistors costs at least several dollars to fabricate and each batch of transistors may contain over a thousand transistors, manufacturers have lost much money through their inability to salvage these defectively-plated but otherwise operative transistors.

Accordingly an object of the invention is to provide a method for selectively dissolving electroless nickel from a substrate.

Another object is to provide a method for selectively removing a coating of electroless nickel from a body composed of other metals and/or glass without the latter materials being significantly attacked.

Another object is to provide a solution which is particularly useful in practicing the method.

Another object is to provide a method and solution for selectively removing coatings of electroless nickel from substrates composed of nickel, copper, steel, Dumet, Kovar and/or glass without substantially attacking any of the latter materials.

Another object is to provide a method and solution for selectively stripping electroless nickel platings from the containers and lead wires of transistors.

Another object is to provide a method of the foregoing type which is rapid and inexpensive.

These objects are achieved in accordance with the invention by using a solution consisting essentially of concentrated nitric acid, concentrated hydrofluoric acid and at least one acid selected from the group consisting of concentrated sulfuric acid and concentrated phosphoric acid. As discussed in detail hereinafter, the specific proportions of acids in the solutions are selected in view of the composition of the substrate upon which the electroless nickel is plated, in a manner such that the nickel is rapidly dissolved from the substrate while the substrate is substantially unattacked by the solution.

In practicing the method of the invention, the above-described solution is applied to the electroless nickel plating to be stripped and is maintained in contact therewith until electroless nickel is removed. To prevent substantial attack on other materials of which the substrate is made, the solution preferably is maintained during its contact with the electroless nickel at a temperature not exceeding about 60° C. It is essential that all acids in the solution be concentrated; dilute acids almost invariably attack a metallic substrate.

Other advantages and features of the invention will be apparent from the following discussion and specific examples directed to preferred forms of my solution and method for stripping electroless nickel from transistor containers and leads secured to glass stems.

*Example 1*

Electroless nickel plating is to be stripped simultaneously from transistor lead wires made of Dumet and transistor containers made of oxygen-free, high-conductivity copper, or cold-rolled steel and commercially pure wrought nickel. Prior to stripping the electroless nickel plating therefrom the transistors are rinsed in water and then are dried thoroughly by rinsing them in reagent-grade methyl alcohol and then centrifuging them. In accordance with the invention, the transistors are immersed and agitated in the novel stripping solution, a preferred formulation of which is:

| Constituent | Volume milliliters |
|---|---|
| Sulfuric acid (concentrated, containing between about 95 and about 98 percent $H_2SO_4$ by weight) | 1,000 |
| Phosphoric acid (concentrated, containing about 85 percent $H_3PO_4$ by weight) | 1,000 |
| Nitric acid (concentrated, containing between about 69 and about 71 percent $HNO_3$ by weight) | 250 |
| Hydrofluoric acid (concentrated, containing about 52 percent HF by weight | 300 |

The solution is prepared by stirring the nitric, sulfuric and hydrofluoric acids into the phosphoric acid. To permit the transistors to be exposed to, agitated in and removed from the solution, the transistors may be contained in a sieve-like polypropylene basket inert to the solution. To prevent substantial attack by the solution on the glass stem and the metals of the transistor container and leads, the solution preferably is maintained during the immersion thereof at room temperature and in any event at a temperature below about 60° C.

After the transistors have been agitated within the solution for about two minutes, they are removed therefrom, rinsed well with cold water and examined to determine whether all of the electroless nickel plating has been removed. If the plating has not all been stripped, the transistors are redried and reimmersed for an additional short period of time, and are then rinsed and examined as before. This process is continued until all of the electroless nickel has been removed. Thereafter the processed transistors are rinsed well in cold water.

When transistors are treated in the foregoing manner, all of the electroless nickel plating thereon is removed without appreciable attack on either the glass stem, the metal container or the lead wires thereof. On the contrary this treatment passivates the metals of the container and leads so that the transistors can be stored in moist air for a considerable time without suffering substantial corrosion. Because this passivation tends to inhibit the plating of metals thereon, the metals of the container and leads should be reactivated just before replating with electroless nickel. Where the container is composed of cold-rolled steel, copper, and/or nickel and the leads are made of Dumet, this reactivation can be achieved simply by immersing the transistors for about 60 seconds in 1:1 hydrochloric acid (a solution composed of equal parts by volume of concentrated hydrochloric acid and water), and then rinsing the units well in deionized water.

While the foregoing example has described the stripping of electroless nickel simultaneously from several metals, the foregoing process also can be used to strip electroless nickel from parts made of any one or less than all of these metals, as well as from parts made of a Kovar alloy. To reactivate the surfaces of parts made either solely of a Kovar alloy or a Kovar alloy and nickel, the following procedure can be employed: The parts are degreased by agitation in toluene for about five mintues, followed by rinsing first in methyl alcohol and then in water. After degreasing, the parts are immersed for about five minutes in a solution consisting essentially of 8 to 15 percent by weight of ammonium bifluoride ($NH_4F \cdot HF$) in water. Thereafter the parts are successively immersed for five seconds in concentrated hydrochloric acid maintained at 70° C., rinsed well in deionized water, immersed for five seconds in 1:1 hydrochloric acid maintained at 70° C., rinsed well in deionized water, immersed for 30 seconds in 1:1 hydrochloric acid maintained at room temperature, and rinsed well in deionized water. The parts are now ready to be replated.

The foregoing example has set forth a specific, preferred solution and process for selectively stripping electroless nickel plating from parts made of copper, steel, nickel, Dumet and/or Kovar. However many other solutions consisting essentially of concentrated nitric acid, concentrated hydrofluoric acid and at least one acid selected from the group consisting of concentrated phosphoric and concentrated sulfuric acid can be used to strip electroless nickel from one or more of the aforementioned substrates. Examples of such solutions are now set forth. In every example each acid is concentrated, i.e. the sulfuric acid contains no less than about 93 percent by weight of $H_2SO_4$, the phosphoric acid contains no less than about 85 percent by weight of $H_3PO_4$, the nitric acid contains no less than about 67 percent by weight of $HNO_3$ and the hydrofluoric acid contains no less than about 47 percent by weight of HF. It has been found that where the acids employed in the solution are substantially more dilute than the foregoing, the additional water introduced thereby frequently causes substantial corrosion of the base metal on which the electroless nickel is plated, hence rendering the solution valueless for the selective stripping of electroless nickel therefrom.

*Example 2*

The following solutions selectively strip electroless nickel from substrates made of one or more of the following metals: commercially pure wrought nickel, cold-rolled steel, oxygen-free, high conductivity copper and Dumet.

| Constituent | Parts by Volume | | | |
|---|---|---|---|---|
| | A | B | C | D |
| Sulfuric acid | 10 | 10 | 10 | 10 |
| Phosphoric acid | 0 to 20 | 10 | 5 | 10 |
| Hydrofluoric acid | 3 | 3 to 6 | 3.75 | 3 |
| Nitric acid | 2.5 | 2.5 | 1.25 | 2.5 to 5 |

*Example 3*

The following solution selectively strips electroless nickel from substrates made of commercially pure wrought nickel and cold-rolled steel or either of these metals.

| Constituent: | Parts by volume |
|---|---|
| Sulfuric acid | 5 to 10 |
| Phosphoric acid | 10 |
| Hydrofluoric acid | 3 |
| Nitric acid | 2.5 |

*Example 4*

The following solutions selectively strip electroless nickel from substrates made of cold-rolled steel and oxygen-free, high-conductivity copper or either of these metals.

| Constituent | Parts by Volume | |
|---|---|---|
| | A | B |
| Sulfuric acid | 10 | 10 |
| Phosphoric acid | 10 | 10 |
| Hydrofluoric acid | 3 | 3.75 |
| Nitric acid | 1.25 to 2.5 | 1.25 |

*Example 5*

The following solution selectively strips electroless nickel from substrates made of Kovar.

| Constituent: | Parts by volume |
|---|---|
| Sulfuric acid | 10 |
| Phosphoric acid | 10 |
| Hydrofluoric acid | 3 |
| Nitric acid | 1.25 to 2.5 |

*Example 6*

The following solutions selectively strip electroless nickel from substrates made of cold-rolled steel.

| Constituent | Parts by Volume | |
|---|---|---|
| | A | B |
| Sulfuric acid | 10 | 10 |
| Phosphoric acid | 10 | 10 |
| Hydrofluoric acid | 3 | 1.3 |
| Nitric acid | 1.25 to 20 | 20 |

*Example 7*

The following solutions selectively strip electroless nickel from substrates made of commercially pure wrought nickel.

| Constituent | Parts by Volume | |
|---|---|---|
| | A | B |
| Sulfuric acid | 0 to 5 | 5 |
| Phosphoric acid | 10 | 10 |
| Hydrofluoric acid | 3 | 3.75 |
| Nitric acid | 2.5 | 1.25 |

The foregoing solutions are only exemplary of the many solutions composed of concentrated nitric acid, concentrated hydrofluoric acid and at least one acid selected from the group consisting of concentrated sulfuric acid and concentrated phosphoric acid which may be employed selectively to strip electroless nickel from a variety of substrate metals, and I do not intend to limit my invention thereto. Moreover, while the examples set forth above relate to the stripping of electroless nickel from one or more of the metals important in the fabrication of transistor containers and lead wires, i.e. commercially pure wrought nickel, cold-rolled steel, oxygen-free, high conductivity copper, Kovar and Dumet, it will be understood by those skilled in the art that the solution and process of the invention can be used selectively to strip electroless nickel from many other substrates.

While I have described my invention by means of specific examples and in a specific embodiment, I do not wish to be limited thereto, for obvious modifications will occur to those skilled in the art without departing from the scope of my invention.

What I claim is:

1. A solution for selectively stripping electroless nickel consisting essentially of nickel and between about 6 and about 13 percent by weight of phosphorus from a substrate composed of at least one substance selected from the group consisting of copper, nickel, steel, Dumet and Kovar, said solution consisting essentially of about 10 parts by volume of sulfuric acid containing at least about 93 percent by weight of $H_2SO_4$, about 10 parts by volume of phosphoric acid containing at least about 85 percent by weight of $H_3PO_4$, about 2.5 to about 5 parts by volume of nitric acid containing at least about 67 percent by weight of $HNO_3$ and about 3 to about 6 percent by volume of hydrofluoric acid containing at least about 47 percent by weight of HF.

2. A solution according to claim 1, wherein said hydrofluoric acid in said solution has a concentration of about 3 parts by volume.

3. A solution according to claim 1, wherein said nitric acid in said solution has a concentration of about 2.5 parts by volume.

4. In a method for selectively removing a coating of electroless nickel consisting essentially of nickel and between about 6 and about 13 percent by weight of phosphorus from a substrate composed of at least one substance selected from the group consisting of copper, nickel, steel, Dumet and Kovar, the steps of contacting said electroless nickel coating with a solution consisting essentially of about 10 parts by volume of sulfuric acid containing at least about 93 percent by weight of $H_2SO_4$, about 10 parts by volume of phosphoric acid containing at least about 85 percent by weight of $H_3PO_4$, about 2.5 to about 5 parts by volume of nitric acid containing at least about 67 percent by weight of $HNO_3$ and about 3 to about 6 percent by volume of hydrofluoric acid containing at least about 47 percent by weight of HF, and continuing said contacting of said electroless nickel coating with said solution until electroless nickel is removed from said substrate.

5. A method according to claim 4, said method including the step of maintaining said solution at a temperature equal to or less than about 60° C. during the time when said solution contacts said electroless nickel coating.

6. A method according to claim 5, wherein said hydrofluoric acid has a concentration of about 3 parts by volume.

7. A method according to claim 5, wherein said nitric acid has a concentration of about 2.5 parts by volume.

References Cited in the file of this patent

UNITED STATES PATENTS

| | | |
|---|---|---|
| 1,765,331 | Gravell | June 17, 1930 |
| 2,200,486 | Burdick | May 14, 1940 |
| 2,337,062 | Page | Dec. 21, 1943 |
| 2,348,359 | Pray | May 9, 1944 |
| 2,353,786 | Ross | July 18, 1944 |
| 2,808,542 | Vermilyea | Oct. 1, 1957 |
| 2,954,289 | Sherwood et al. | Sept. 27, 1960 |

FOREIGN PATENTS

| | | |
|---|---|---|
| 459,130 | Great Britain | Dec. 24, 1936 |

OTHER REFERENCES

"Solutions for Stripping Metallic Coatings," Hogaboom and Hall, Plating and Finishing Guidebook, 1940 (Nickel from Steel, p. 60).